(12) United States Patent
Matsushita et al.

(10) Patent No.: US 11,835,663 B2
(45) Date of Patent: Dec. 5, 2023

(54) ULTRASONIC SENSOR

(71) Applicant: Murata Manufacturing Co., Ltd., Nagaokakyo (JP)

(72) Inventors: Tomoaki Matsushita, Nagaokakyo (JP); Kazuhiro Ebara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 429 days.

(21) Appl. No.: 17/323,098

(22) Filed: May 18, 2021

(65) Prior Publication Data

US 2021/0270949 A1     Sep. 2, 2021

Related U.S. Application Data

(63) Continuation of application No. PCT/JP2019/051198, filed on Dec. 26, 2019.

(30) Foreign Application Priority Data

Jan. 23, 2019   (JP) ................. 2019-009697

(51) Int. Cl.
   *G01S 7/521*     (2006.01)
   *H04R 17/00*    (2006.01)
   *H10N 30/88*    (2023.01)
   *B06B 1/06*       (2006.01)

(52) U.S. Cl.
   CPC ............ *G01S 7/521* (2013.01); *B06B 1/0685* (2013.01); *H04R 17/00* (2013.01); *H10N 30/883* (2023.02)

(58) Field of Classification Search
   CPC .. H10N 30/883; B06B 1/0681; B06B 1/0685; G01S 7/521; G01H 11/08; H04R 17/00
   See application file for complete search history.

(56) References Cited

U.S. PATENT DOCUMENTS 7,956,516 B2 * 6/2011 Hayashi ............... G10K 11/002
                                                                310/326

FOREIGN PATENT DOCUMENTS

| JP | H11266498 A | 9/1999 |
|----|-------------|--------|
| JP | 2000023289 A | 1/2000 |
| JP | 2006352829 A | 12/2006 |

(Continued)

OTHER PUBLICATIONS

Written Opinion of the International Search Authority issued for PCT/JP2019/051198, dated Mar. 10, 2020.

(Continued)

*Primary Examiner* — Justin N Olamit
(74) *Attorney, Agent, or Firm* — ArentFox Schiff LLP

(57) ABSTRACT

An ultrasonic sensor having a case including a bottom section and a peripheral wall section; a piezoelectric device on the bottom section inside the case; and a resin foam filler filling at least part of the case and covering the piezoelectric device. An inner surface of the case includes a first region and a second region, a surface roughness of the first region is higher than a surface roughness of the second region, the first region includes at least part of the bottom section and/or a portion of the peripheral wall section facing the piezoelectric device, the second region is on the peripheral wall section and is farther from the piezoelectric device than the first region, and the resin foam filler contacts each of the first region and the second region.

15 Claims, 2 Drawing Sheets

(56) References Cited

FOREIGN PATENT DOCUMENTS

| | | |
|---|---|---|
| JP | 2010050963 A | 3/2010 |
| JP | 2018098666 A | 6/2018 |
| WO | 2016104415 A1 | 8/2016 |

OTHER PUBLICATIONS

International Search Report issued for PCT/JP2019/051198, dated Mar. 10, 2020.

* cited by examiner

ULTRASONIC SENSOR

CROSS REFERENCE TO RELATED APPLICATIONS

The present application is a continuation of International application No. PCT/JP2019/051198, filed Dec. 26, 2019, which claims priority to Japanese Patent Application No. 2019-009697, filed Jan. 23, 2019, the entire contents of each of which are incorporated herein by reference.

FIELD OF THE INVENTION

The present invention relates to an ultrasonic sensor.

BACKGROUND OF THE INVENTION

Examples of prior art documents that disclose the configurations of ultrasonic sensors are Japanese Unexamined Patent Application Publication No. 2010-050963 (Patent Document 1), Japanese Unexamined Patent Application Publication No. 2006-352829 (Patent Document 2), and International Publication No. 2016/104415 (Patent Document 3).

The ultrasonic sensor disclosed in Patent Document 1 includes an ultrasonic sensor case, a piezoelectric device, a pair of lead lines, and a sound absorber. The ultrasonic sensor case includes a vibrating section and a side wall section. The vibrating section has a planar shape, and the piezoelectric device is disposed on the vibrating section. The side wall section is disposed to enclose a region where the piezoelectric device is disposed on the vibrating section. The side wall section has a cavity at a position at which it faces the vibrating section. The pair of lead lines is electrically connected to a pair of electrodes of the piezoelectric device and extends to the outside of the ultrasonic sensor case. The sound absorber is disposed inside the ultrasonic sensor case so as to contact the piezoelectric device and the inner surface of the ultrasonic sensor case. The sound absorber is made of silicone foam or felt.

The ultrasonic sensor disclosed in Patent Document 2 includes a cylindrical case with a closed bottom, a piezoelectric device, resin foam, a lid member, and terminals. The piezoelectric device is formed on the bottom surface inside the case. The resin foam fills the inside of the case so as to cover the piezoelectric device. The lid member is fit in a cavity of the case. Through-holes are formed in the lid member. The terminals are fixed to the lid member so as to be electrically connected to the piezoelectric device.

The ultrasonic sensor disclosed in Patent Document 3 includes a case, a piezoelectric device, and a filling resin. The case has a cylindrical shape with a closed bottom and includes a bottom plate and a side wall. The piezoelectric device is disposed on the bottom plate inside the case. The filling resin fills at least part of the inside of the case so as to cover the piezoelectric device in the case.

Patent Document 1: Japanese Unexamined Patent Application Publication No. 2010-050963
Patent Document 2: Japanese Unexamined Patent Application Publication No. 2006-352829
Patent Document 3: International Publication No. 2016/104415

SUMMARY OF THE INVENTION

A filler to fill the inside of a case of an ultrasonic sensor may be made of a resin foam material, such as a silicone foam material. In this case, as the expansion ratio of the filler is higher, sound absorption characteristics of the filler are enhanced, but on the other hand, vibration damping characteristics of the filler are decreased. The filler has a function of attenuating a ringing signal in the ultrasonic sensor. To improve ringing-attenuation characteristics of the ultrasonic sensor, it is desirable that the sound absorption characteristics of the filler around a piezoelectric device be high and the vibration damping characteristics of the filler away from the piezoelectric device be high.

The present invention has been made to address the above-described issue. It is an object of the present invention to provide an ultrasonic sensor whose ringing-attenuation characteristics are improved by making the expansion ratio of a portion of a filler, which is made of resin foam, different from that of another portion of the filler.

An ultrasonic sensor of the present invention includes a case, a piezoelectric device, and a filler. The case includes a bottom section and a peripheral wall section. The piezoelectric device is disposed on the bottom section inside the case. The filler fills at least part of the case so as to cover the piezoelectric device. The filler is made of resin foam. An inner surface of the case includes a first region and a second region. The surface roughness of the first region is higher than that of the second region. The first region includes at least part of the bottom section and/or a portion of the peripheral wall section facing the piezoelectric device, the second region is on the peripheral wall section and is farther from the piezoelectric device than the first region, and the filler contacts each of the first region and the second region.

According to the present invention, it is possible to improve ringing-attenuation characteristics of an ultrasonic sensor by making the expansion ratio of a portion of a filler, which is made of resin foam, different from that of another portion of the filler.

DETAILED DESCRIPTION OF THE PREFERRED EMBODIMENTS

Figure 1:
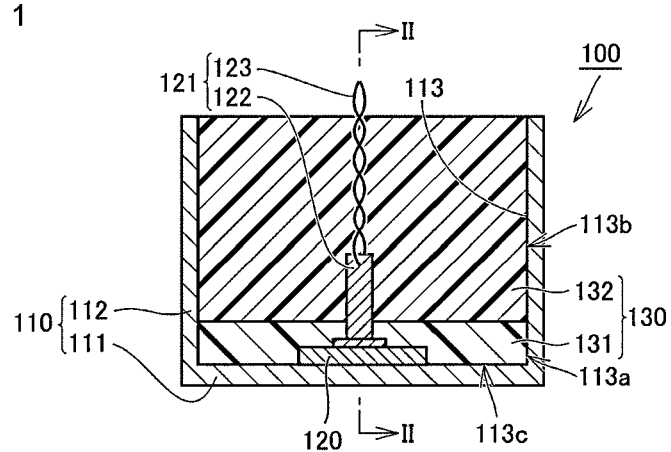
FIG. 1 is a longitudinal sectional view of an ultrasonic sensor according to an embodiment of the present invention.

An ultrasonic sensor according to an embodiment of the present invention will be described below with reference to the drawings. In the following description of the embodiment, the same element or associated elements are designated by like reference numeral and an explanation thereof will not be repeated.

Figure 2:
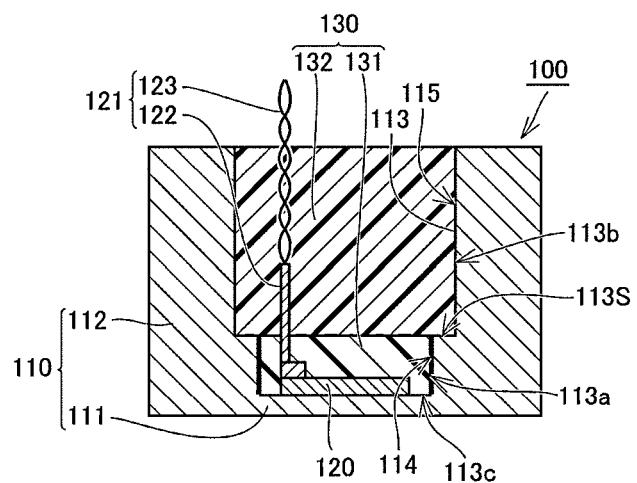
FIG. 2 is a longitudinal sectional view of the ultrasonic sensor shown in FIG. 1, as viewed from the direction indicated by the arrows of line II-II in FIG. 1.
Figure 3:
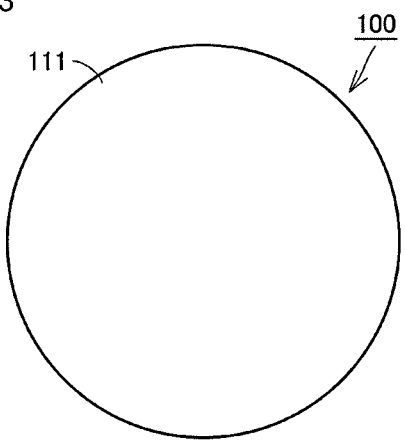
FIG. 3 is a bottom view of the ultrasonic sensor according to an embodiment of the present invention.

FIG. 1 is a longitudinal sectional view of an ultrasonic sensor according to an embodiment of the present invention. FIG. 2 is a longitudinal sectional view of the ultrasonic sensor shown in FIG. 1, as viewed from the direction indicated by the arrows of line II-II in FIG. 1. FIG. 3 is a bottom view of the ultrasonic sensor according to an embodiment of the present invention.

As shown in FIGS. 1 through 3, an ultrasonic sensor 100 according to an embodiment of the invention includes a case 110, a piezoelectric device 120, and a filler 130.

As shown in FIGS. 1 through 3, the case 110 is formed in a cylindrical shape with a closed bottom and includes a bottom section 111 and a peripheral wall section 112. The piezoelectric device 120 is disposed on the bottom section 111 inside the case 110. The filler 130 fills the inside of the case 110 and covers the piezoelectric device 120 in the case 110.

As shown in FIG. 3, the outer shape of the bottom section 111 of the case 110 is circular as viewed from a direction perpendicular to the bottom surface. However, the outer shape of the bottom section 111 is not limited to be circular and may be rectangular or polygonal as viewed from a direction perpendicular to the bottom surface. In an embodiment of the invention, the diameter of the bottom section 111 is 14.0 mm, for example.

The peripheral wall section 112 is connected with the periphery of the bottom section 111. In an embodiment of the invention, the height of the case 110 from the outer bottom surface of the bottom section 111 opposite the surface connected with the peripheral wall section 112 to the top end of the peripheral wall section 112 is 9.0 mm, for example.

The longitudinal section of the ultrasonic sensor shown in FIG. 2 is a longitudinal section passing through the center axis of the case 110, and more particularly, a longitudinal section having the minimum internal width of the case 110. Hereinafter, this longitudinal section may also be simply called the main section.

As shown in FIG. 2, in the main section of the ultrasonic sensor 100 according to an embodiment of the invention, a step face 113S is formed on an inner surface 113 of the case 110. In an embodiment of the invention, the step face 113S is parallel with the bottom surface of the case 110.

The inner peripheral surface of the peripheral wall section 112 includes a first inner peripheral surface 113a and a second inner peripheral surface 113b which are separated from each other at the step face 113S as the boundary. The first inner peripheral surface 113a is proximal to the bottom section 111, while the second inner peripheral surface 113b is distal from the bottom section 111 relative to the first inner peripheral surface 113a. Each of the first inner peripheral surface 113a and the second inner peripheral surface 113b is rectangular as viewed from a direction perpendicular to the bottom surface of the case 110.

As shown in FIG. 1, when the ultrasonic sensor 100 according to an embodiment of the invention is seen from the longitudinal section perpendicular to the main section, the step face 113S is invisible on the inner surface 113 of the case 110.

The width of the step face 113S is 3 mm, for example. That is, in the main section shown in FIG. 2, the distance from one side to the other side of the first inner peripheral surface 113a is smaller than that of the second inner peripheral surface 113b by 6 mm. The height of the first inner peripheral surface 113a is 1.52 mm, for example.

As shown in FIG. 1, when the ultrasonic sensor 100 according to an embodiment of the invention is seen from the longitudinal section perpendicular to the main section, the thickness of the peripheral wall section 112 is substantially uniform from the bottom section 111 to the top end of the peripheral wall section 112.

In an embodiment of the invention, the inner surface 113 of the case 110 is constituted by the first inner peripheral surface 113a, the second inner peripheral surface 113b, the step face 113S, and an inner bottom surface 113c of the bottom section 111 positioned close to the peripheral wall section 112.

As shown in FIG. 2, the inner surface 113 of the case 110 includes a first region 114 and a second region 115 whose surface roughness levels are different from each other. The surface roughness of the first region 114 is higher than that of the second region 115.

In an embodiment of the invention, as shown in FIG. 2, the first region 114 is disposed on the entirety of a pair of opposing sides of the first inner peripheral surface 113a which are seen in the main section. The first region 114 may alternatively be disposed only on a portion of each of these opposing sides of the first inner peripheral surface 113a. More specifically, the first region 114 may be disposed on a portion of each of these opposing sides which face the piezoelectric device 120.

Alternatively, the first region 114 may be disposed partially on a pair of opposing sides of the first inner peripheral surface 113a which are seen in the longitudinal section shown in FIG. 1 perpendicular to the main section. More specifically, the first region 114 may be disposed on a portion of each of these opposing sides which face the piezoelectric device 120. The first region 114 may alternatively be provided on the entirety of the first inner peripheral surface 113a.

Figure 4:
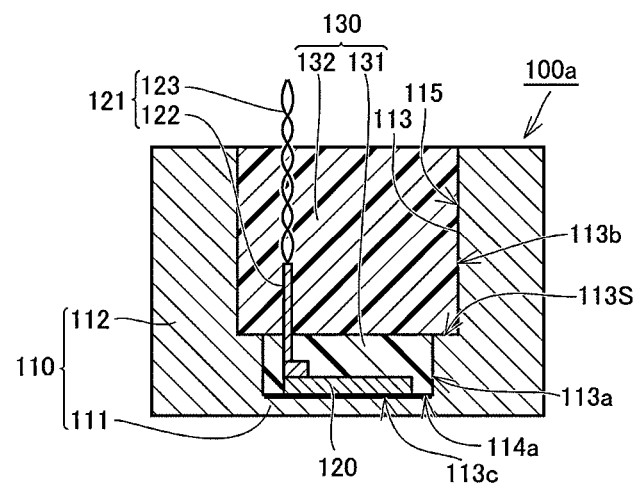
FIG. 4 is a longitudinal sectional view of an ultrasonic sensor according to a modified example of an embodiment of the present invention.

The first region 114 may be provided on the inner bottom surface 113c. FIG. 4 is a longitudinal sectional view of an ultrasonic sensor according to a modified example of an embodiment of the invention. In FIG. 4, a main section similar to that in FIG. 2 is shown.

As shown in FIG. 4, in an ultrasonic sensor 100a according to this modified example, a first region 114a is disposed on the entirety of the inner bottom surface 113c. The first region 114a may alternatively be disposed only on a portion of the inner bottom surface 113c which is not in contact with the piezoelectric device 120.

As described above, the first region 114 is disposed on at least part of an area of the case, the area being constituted by the bottom section 111 and a portion of the peripheral wall section 112 which faces the piezoelectric device 120. The first region 114 may be disposed on the bottom section 111 or on a portion of the peripheral wall section 112 which faces the piezoelectric device 120. The first region 114 may be disposed both on the bottom section 111 and on a portion of the peripheral wall section 112 which faces the piezoelectric device 120.

In an embodiment of the invention, the surface roughness Ra of the first region 114 is preferably 0.12 to 4.4 μm, and more preferably, 1.2 to 3.8 μm.

As shown in FIG. 2, in an embodiment of the invention, the second region 115 is disposed on the entirety of each of the step face 113S and the second inner peripheral surface 113b. The second region 115 may alternatively be disposed on at least part of the step face 113S and the second inner peripheral surface 113b. For example, the second region 115 may be provided on the second inner peripheral surface 113b along the entire top end of the peripheral wall section 112.

In this manner, in an embodiment of the invention, the second region 115 is located on the peripheral wall section 112 that is farther from the piezoelectric device 120 than the first region 114.

The case 110 is made of a conductive material. In an embodiment of the invention, the case 110 is made of an aluminum alloy. The case 110 is formed by forging, for example. The material forming the case 110 is not restricted to a conductive material and may be an insulating material.

In an embodiment of the invention, the outer shape of the piezoelectric device 120 is planar. The outer shape of the piezoelectric device 120 seen from a direction perpendicular to the bottom surface of the case 110 is not restricted to a particular shape and may be circular, rectangular, or polygonal, for example.

The piezoelectric device 120 is made of ceramics, for example. In an embodiment of the invention, the piezoelectric device 120 is made of PZT (lead zirconate titanate) ceramics. The material forming the piezoelectric device 120 is not limited to PZT ceramics and may be another type of piezoelectric material.

The piezoelectric device has one main surface and the other main surface. With the application of a voltage to an electrode disposed on each of the main surfaces, the piezoelectric device 120 is driven and vibrates. The piezoelectric device 120 and the case 110 are bonded to each other using an epoxy resin, for example.

When the bottom section 111 of the case 110 vibrates upon receiving ultrasonic waves from an external source, the piezoelectric device 120 also vibrates accordingly. As a result of the piezoelectric device 120 generating electric charge by vibration, the ultrasonic waves are converted into an electric signal in the piezoelectric device 120. The electric signal is transmitted to the outside via the electrode disposed on each of the main surfaces of the piezoelectric device 120.

As shown in FIGS. 1 and 2, the ultrasonic sensor 100 according to an embodiment of the invention also includes a conductor 121. The conductor 121 is connected to each of the main surfaces of the piezoelectric device 120. More specifically, the conductor 121 is electrically connected to the electrode disposed on one main surface and that on the other main surface of the piezoelectric device 120.

The conductor 121 includes a substrate 122 and two wiring portions 123. In an embodiment of the invention, the substrate 122 is constituted by a FPC (flexible printed circuit substrate) having a resin sheet and wiring.

In an embodiment of the invention, the resin sheet is made from polyimide, while the wiring is made of copper. The wiring of the substrate 122 and the piezoelectric device 120 are bonded to each other using a conductive adhesive. As the conductive adhesive, a mixture of an epoxy resin and solder is used, for example.

Each of the two wiring portions 123 is electrically connected to the wiring of the substrate 122. In an embodiment of the invention, the two wiring portions 123 and the wiring of the substrate 122 are bonded to each other by solder. The two wiring portions 123 extend from the filler 130 to the outside of the ultrasonic sensor 100.

One of the two wiring portions 123 is electrically connected via the intervening substrate 122 to the electrode disposed on one main surface of the piezoelectric device 120. The other wiring portion 123 is electrically connected via the intervening substrate 122 to the electrode disposed on the other main surface of the piezoelectric device 120.

In an embodiment of the invention, the two wiring portions 123 extend to the outside of the ultrasonic sensor 100 as a single lead line constituted by stranded wire.

As shown in FIGS. 1 and 2, the filler 130 fills the case 110 so as to cover the conductor 121 inside the case 110. In an embodiment of the invention, the filler 130 fills the entirety of the inside of the case 110. The filler 130 may fill part of the inside of the case 110 as long as it covers the piezoelectric device 120.

The filler 130 is made of resin foam. In an embodiment of the invention, the filler 130 is made of silicone foam. The filler 130 may alternatively be made of polyurethane foam.

The filler 130 made of silicone foam may be formed by potting. In potting, a liquid silicone resin is applied to the top of the bottom section 111 of the case 110 and the top of the piezoelectric device 120 and is caused to solidify. The filler 130 can thus be in close contact with the piezoelectric device 120 regardless of the shape of the piezoelectric device 120.

The filler 130 made of resin foam has a closed cell structure. If the filler 130 is made of silicone foam, the closed cell structure is formed by a gas generated during the solidification reaction when the liquid silicone resin is solidified. The filler 130 may have a closed cell structure and an open cell structure.

In an embodiment of the invention, the filler 130 contacts each of the first region 114 and the second region 115. For this reason, the expansion ratio of a portion of the filler 130 is different from that of another portion of the filler 130 in an embodiment of the invention. More specifically, the expansion ratio of a portion of the filler 130 near the first region 114 and that of a portion of the filler 130 near the second region 115 are different from each other.

The mechanism that makes the expansion ratio of a portion of the filler 130 different from that of another portion of the filler 130 will be explained below.

An explanation will first be given of energy necessary for producing cells within the filler 130 by a gas generated during the solidification reaction of the filler 130. A cell becomes more stable energetically as the volume V of the cell is larger. If the cell is assumed to have a spherical shape having a radius r, potential energy $U_1(r)$ of the cell volume can be expressed by the following equation (1), where a is a positive proportional constant.

$$U_1(r) = -aV = -4a\pi r^3/3 \tag{1}$$

Interfacial energy $U_2(r)$ between the cell and the filler 130 is proportional to the contact area between the cell and the filler 130, that is, the surface area S of the cell. The interfacial energy $U_2(r)$ of the cell can be expressed by the following equation (2), where b is a positive proportional constant.

$$U_2(r) = -bS = 4b\pi r^2 \tag{2}$$

The following equation (3) is thus derived to find the energy U(r) of the cell.

$$U(r) = U_1(r) + U_2(r) = 4b\pi r^2 - 4a\pi r^3/3 \tag{3}$$

Equation (3) shows that, when the value of r exceeds 0 and smaller than 2b/a, the energy U(r) of the cell becomes higher as the value of r is larger. That is, when the value of r exceeds 0 and smaller than 2b/a, the cell becomes stable energetically as the radius r of the cell is smaller, and the cell is thus likely to shrink.

In contrast, when the value of r is 2b/a or greater, the energy U(r) of the cell becomes lower as the value of the radius r is larger. That is, when the value of r is 2b/a or greater, the cell becomes stable energetically as the radius r of the cell is larger, and the cell is thus likely to expand.

As described above, when the value of r is smaller than 2b/a, the cell shrinks and disappears. In other words, to generate a cell, it is necessary that the value of r be 2b/a or greater. That is, the energy $U_0$ required for generating a cell in the filler 130 can be expressed by the following equation (4).

$$U_0 = U(2b/a) = 16\pi b^3/(3a^3) \quad (4)$$

Figure 5:
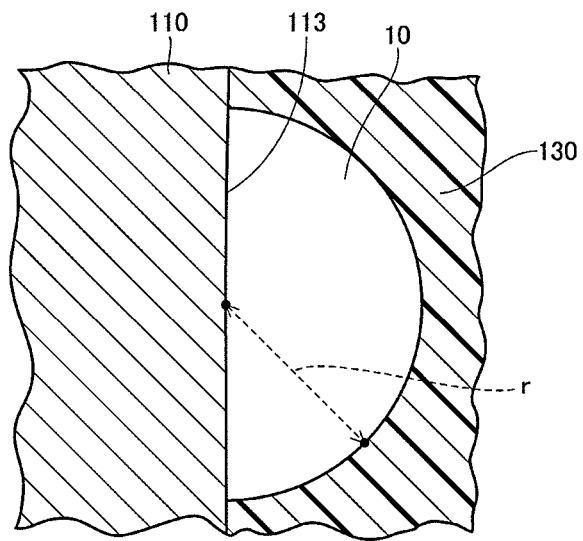
FIG. 5 is an enlarged sectional view illustrating part of the interface between the inner surface of a case and a filler in an ultrasonic sensor according to an embodiment of the invention.

A description will now be given of a situation where a cell is generated at the interface between the inner surface 113 of the case 110 and the filler 130. FIG. 5 is an enlarged sectional view illustrating part of the interface between the inner surface of the case and the filler in an ultrasonic sensor according to an embodiment of the invention. As shown in FIG. 5, the shape of a cell 10 generated at the interface between the inner surface 113 of the case 110 and the filler 130 is substantially semispherical.

The volume of the semispherical cell 10 is half the volume of a spherical cell generated within the filler 130. The contact area of the semispherical cell 10 with the filler 130 is also half the contact area of the spherical cell generated within the filler 130. The following equation (5) is thus derived to find the energy U(r) of the semispherical cell 10.

$$U(r) = 2b\pi r^2 - 2a\pi r^3/3 \quad (5)$$

In a manner similar to determining energy for generating a spherical cell within the filler 130, the energy $U_0$ required for generating the semispherical cell 10 can be expressed by the following equation (6).

$$U_0 = U(2b/a) = 8\pi b^3/(3a^3) \quad (6)$$

From equations (4) and (6), in an embodiment of the invention, energy necessary for forming the semispherical cell 10 at the interface between the inner surface 113 of the case 110 and the filler 130 is found to be lower than that for forming a spherical cell within the filler 130.

In an embodiment of the invention, the surface roughness of the first region 114 is higher than that of the second region 115. The surface area of the inner surface 113 of the case 110 in the first region 114 is thus larger than that in the second region 115. That is, the area of the interface of the first region 114 with the filler 130 where cells are likely to be generated is larger than that of the second region 115. In the filler 130, more cells are generated in a portion 131 which contacts the first region 114 than in a portion 132 which contacts the second region 115, and the expansion ratio in the portion 131 is hence higher than that in the portion 132.

In this manner, in an embodiment of the invention, the expansion ratio of the filler 130 is different depending on a portion of the filler 130 whether this portion contacts the first region 114 or the second region 115.

It is preferable that the expansion ratio of the portion 131 of the filler 130 which contacts the first region 114 be 1.17 times or greater as high as that of the portion 132 of the filler 130 which contacts the second region 115.

EXPERIMENT EXAMPLES

A description will now be given of an experiment example carried out to examine the relationship between the surface roughness of the first region 114 and the characteristics of the ultrasonic sensor.

In this experiment example, ultrasonic sensors according to example 1 through example 6 were made. The ultrasonic sensors according to example 1 through example 6 were made by varying the surface roughness Ra of the first region 114 of the ultrasonic sensor 100 according to an embodiment of the invention. In all the examples, the surface roughness of the first region 114 is higher than that of the second region 115.

First, the case 110 was prepared for each of the ultrasonic sensors of example 1 through example 6. The external dimensions of the case 110 were 14 mm in diameter and 9 mm in height. The width of the step face 113S was 3 mm. The height of the first inner peripheral surface 113a was 1.52 mm. The first region 114 was provided on the entirety of a pair of opposing sides of the first inner peripheral surface 113a which were seen in the main section.

Then, for the ultrasonic sensor of each of the examples, after the piezoelectric device 120 and the conductor 121 were disposed within the case 110, a silicone foam material was filled into a portion of the case 110 below the step face 113S. The silicone foam material is a material which foams during this filling process.

In the ultrasonic sensor of each of the examples, the expansion ratio of the silicone foam material filled into the portion of the case 110 below the step face 113S was measured. Hereinafter, the expansion ratio of the silicone foam material filled into this portion may simply be called the lower-portion expansion ratio. In each of the examples, the silicone foam material filled into the portion of the case 110 below the step face 113S corresponds to the portion 131 of the filler 130 which contacts the first region 114.

To measure the lower-portion expansion ratio, for the ultrasonic sensor of each of the examples, a case 110 having the same shape for each example was separately prepared, and after the piezoelectric device 120 and the conductor 121 were disposed within the case 110, a silicone foam material was filled into a portion of the case 110 below the step face 113S while being prevented from foaming in a vacuum.

For the ultrasonic sensor of each of the examples, the mass M1 of the ultrasonic sensor in which the portion of the case 110 below the step face 113S was filled with the silicone foam material which foamed and the mass M2 of the ultrasonic sensor in which the portion of the case 110 below the step face 113S was filled with the silicone foam material which did not foam were measured. The volumes of the silicone foam materials filled into the above-described portions of the cases 110 of the two ultrasonic sensors were substantially the same. Hence, the lower-portion expansion ratio was calculated by dividing the mass M2 by the mass M1.

Then, for the ultrasonic sensor of each of the examples, a silicone foam material was filled into a portion of the case 110 above the step face 113S. The silicone foam material is a material which foams during this filling process. As a result of this process, the entirety of the inside of the case 110 was filled with the silicone foam material which foamed. Hereinafter, the expansion ratio of the silicone foam material filled into this portion may simply be called the upper-portion expansion ratio. In each of the examples, the silicone foam material filled into the portion of the case 110 above the step face 113S corresponds to the portion 132 of the filler 130 which contacts the second region 115.

To measure the upper-portion expansion ratio, for the ultrasonic sensor of each of the examples, the case 110 separately prepared to measure the lower-portion expansion ratio was used. That is, the portion of this case 110 below the step face 113S was filled with the silicone foam material which did not foam. Then, a silicone foam material was filled into a portion of this case 110 above the step face 113S while being prevented from foaming in a vacuum. As a result, the entirety of the inside of the case 110 was filled with the silicone foam material which did not foam.

For the ultrasonic sensor of each of the examples, the mass M3 of the ultrasonic sensor in which the entirety of the inside of the case 110 was filled with the silicone foam material which foamed and the mass M4 of the ultrasonic sensor in which the entirety of the inside of the case 110 was filled with the silicone foam material which did not foam were measured. The volumes of the silicone foam materials filled into the cases 110 of the two ultrasonic sensors were substantially the same. Hence, the upper-portion expansion ratio was calculated by dividing the mass (M4−M2) by the mass (M3−M1).

By dividing the lower-portion expansion ratio by the upper-portion expansion ratio, the relative expansion ratio was calculated.

For the ultrasonic sensor of each of the examples made as described above, a power supply was connected to the conductor 121, and a pulse voltage of 120 V was applied to the piezoelectric device 120 at its resonant frequency. The ringing time of the ultrasonic sensor was measured with an oscilloscope. In this experiment example, the time from when the application of the voltage using the power supply was stopped until when the ringing voltage was reduced to 0.5 V or lower was determined to be the ringing time.

Additionally, a pole having a diameter of 75 mm was placed at a distance of 1.0 m from the ultrasonic sensor of each of the examples. When the above-described pulse voltage was applied to the piezoelectric device 120, ultrasonic waves from the ultrasonic sensor reached the pole and returned from the pole by reflection. The voltage of the ultrasonic waves returned from the pole was measured and determined to be the total sensitivity. The total sensitivity levels of the examples were compared with each other.

For the ultrasonic sensor of each of example 1 through example 6, the surface roughness Ra of the first region and the calculation results regarding the lower-portion expansion ratio, the relative expansion ratio, the ringing time, and the total sensitivity (detected voltage) are shown in the following Table 1. In Table 1, regarding each of the ringing time and the total sensitivity, relative values based on the value of example 4, which is set to be 1, are indicated.

The ultrasonic sensor of example 4 has a short range detecting function and a long range detection function. The short range detecting function is a function of detecting ultrasonic waves having reached a pole placed at a distance of 30 cm from the ultrasonic sensor and having returned from the pole by reflection. The long range detecting function is a function of detecting ultrasonic waves having reached a pole placed at a distance of 3 m from the ultrasonic sensor and having returned from the pole by reflection. When the ringing time exceeds 1.5, it is difficult to maintain the short range detecting function.

TABLE 1

|  | Example 1 | Example 2 | Example 3 | Example 4 | Example 5 | Example 6 |
| --- | --- | --- | --- | --- | --- | --- |
| Surface roughness Ra [μm] | 0.06 | 0.12 | 1.2 | 3.8 | 4.4 | 6.2 |
| Lower-portion expansion ratio | 1.15 | 1.20 | 1.50 | 1.67 | 1.36 | 1.25 |
| Relative expansion ratio | 1.10 | 1.17 | 1.20 | 1.42 | 1.23 | 1.13 |
| Ringing time | 1.55 | 1.44 | 1.11 | 1.00 | 1.22 | 2.33 |
| Total sensitivity | 0.33 | 0.41 | 0.65 | 1.00 | 0.82 | 0.39 |
| Short range detection | Fair | Good | Good | Good | Good | Fair |
| Long range detection | Fair | Fair | Good | Good | Good | Fair |

Table 1 shows that, for all the ultrasonic sensors of example 1 through example 6, the relative expansion ratio is 1 or higher since the surface roughness of the first region 114 is higher than that of the second region 115.

Table 1 also shows that, for all the ultrasonic sensors 100 of example 2 through example 5 whose surface roughness Ra is 0.12 to 4.4 μm, the relative expansion ratio is 1.17 or higher and the ringing time is shorter than those of example 1 and example 6. This means that the ringing-attenuation characteristics are improved and the short range detecting function is accordingly enhanced. The reason for this is as follows. Due to a surface roughness Ra of 0.12 to 4.4 μm, the interface between the filler 130 and the inner surface 113 of the case 110 in the first region 114 is effectively increased. This can raise the lower-portion expansion ratio, thereby enhancing the sound absorption characteristics of the filler 130 around the piezoelectric device 120.

In example 6, due to a high surface roughness Ra, a silicone foam material failed to flow into between the filler 130 and the inner surface 113 of the case 110 in the first region 114, resulting in the presence of voids. This makes the ringing time longer.

In example 3 and example 4 having a surface roughness Ra of 1.2 to 3.8 μm, the total sensitivity is elevated and, not only the short range detecting function, but also the long range detecting function is enhanced. The reason for this is as follows. Since both of the lower-portion expansion ratio and the relative expansion ratio can be made higher, as well as the sound absorption characteristics of the filler 130 around the piezoelectric device 120, the vibration damping characteristics of the filler 130 away from the piezoelectric device 120 are improved.

As described above, in the ultrasonic sensor 100 according to an embodiment of the present invention, the filler 130 is made of resin foam. The inner surface 113 of the case 110 includes the first region 114 and the second region 115 whose surface roughness levels are different from each other. The surface roughness of the first region 114 is higher than that of the second region 115. The first region 114 is disposed on at least part of an area of the case 110, the area being constituted by the bottom section 111 and a portion of the peripheral wall section 112 which faces the piezoelectric device 120. The second region 115 is located on the peripheral wall section 112 and is separated farther from the piezoelectric device 120 than the first region 114 is. The filler 130 contacts each of the first region 114 and the second region 115.

With this configuration, it is possible to improve the ringing-attenuation characteristics of the ultrasonic sensor 100 by making the expansion ratio of a portion of the filler 130 different from that of another portion of the filler 130.

In the ultrasonic sensor 100 according to an embodiment of the invention, the filler 130 is made of silicone foam or polyurethane foam.

With this configuration, the expansion ratio of the filler 130 can be made different depending on the position of the filler 130 inside the case 110.

In the ultrasonic sensor 100 according to an embodiment of the invention, the surface roughness Ra of the first region 114 is 0.12 to 4.4 μm.

This makes it possible to enhance the ringing-attenuation characteristics of the ultrasonic sensor 100 by reducing the occurrence of voids, while increasing the expansion ratio of a portion of the filler 130 positioned around the piezoelectric device 120.

In the ultrasonic sensor 100 according to an embodiment of the invention, the expansion ratio of the portion 131 of the filler 130 which contacts the first region 114 is 1.17 times or greater as high as that of the portion 132 of the filler 130 which contacts the second region 115.

This can decrease the ringing time of the ultrasonic sensor 100, thereby improving the short range detecting function.

In the above-described embodiment, some of the configurations may be combined with each other within a technically possible range.

The disclosed embodiment and examples are provided only for the purposes of illustration, but are not intended to be exhaustive or to limit the invention to the precise forms disclosed. It is intended that the scope of the invention be defined, not by the foregoing embodiment and examples, but by the following claims. The scope of the present invention is to be accorded the broadest interpretation so as to encompass all such modifications and equivalent structures and functions.

REFERENCE SIGNS LIST 10 cell, 100, 100a ultrasonic sensor, 110 case, 111 bottom section, 112 peripheral wall section, 113 inner surface, 113S step face, 113a first inner peripheral surface, 113b second inner peripheral surface, 113c inner bottom surface, 114, 114a first region, 115 second region, 120 piezoelectric device, 121 conductor, 122 substrate, 123 wiring portion, 130 filler, 131 portion in contact with first region, 132 portion in contact with second region

The invention claimed is:

1. An ultrasonic sensor comprising:
a case including a bottom section and a peripheral wall section;
a piezoelectric device on the bottom section inside the case; and
a resin foam filler filling at least part of the case and covering the piezoelectric device, wherein
an inner surface of the case includes a first region and a second region,
a surface roughness of the first region is higher than a surface roughness of the second region,
the first region includes at least part of the bottom section and/or a portion of the peripheral wall section facing the piezoelectric device,
the second region is on the peripheral wall section and is farther from the piezoelectric device than the first region,
the resin foam filler contacts each of the first region and the second region, and
the inner surface of the case includes a step face between the first region and the second region.

2. The ultrasonic sensor according to claim 1, wherein the resin foam filler is made of silicone foam or polyurethane foam.

3. The ultrasonic sensor according to claim 1, wherein surface roughness of the first region is 0.12 to 4.4 μm.

4. The ultrasonic sensor according to claim 1, wherein the surface roughness of the first region is 1.2 to 3.8 μm.

5. The ultrasonic sensor according to claim 1, wherein an expansion ratio of a portion of the resin foam filler which contacts the first region is 1.17 times or greater of an expansion ratio of a portion of the resin foam filler which contacts the second region.

6. The ultrasonic sensor according to claim 1, wherein the first region is an entirety of the bottom section facing the piezoelectric device.

7. The ultrasonic sensor according to claim 6, wherein the surface roughness of the first region is 0.12 to 4.4 μm.

8. The ultrasonic sensor according to claim 6, wherein the surface roughness of the first region is 1.2 to 3.8 μm.

9. The ultrasonic sensor according to claim 1, wherein the first region is a portion of the bottom section facing the piezoelectric device that is not in contact with the piezoelectric device.

10. The ultrasonic sensor according to claim 9, wherein the surface roughness of the first region is 0.12 to 4.4 μm.

11. The ultrasonic sensor according to claim 9, wherein the surface roughness of the first region is 1.2 to 3.8 μm.

12. The ultrasonic sensor according to claim 1, wherein an expansion ratio of a portion of the resin foam filler which contacts the first region is greater than an expansion ratio of a portion of the resin foam filler that contacts the second region.

13. An ultrasonic sensor comprising:
a case including a bottom section and a peripheral wall section;
a piezoelectric device on the bottom section inside the case; and
a resin foam filler filling at least part of the case and covering the piezoelectric device, wherein
an inner surface of the case includes a first region and a second region,
a surface roughness of the first region is higher than a surface roughness of the second region,
the first region includes at least part of the bottom section and/or a portion of the peripheral wall section facing the piezoelectric device,
the second region is on the peripheral wall section and is farther from the piezoelectric device than the first region,
the resin foam filler contacts each of the first region and the second region, and
the first region includes an entirety of a pair of opposing sides of the peripheral wall section facing the piezoelectric device.

14. The ultrasonic sensor according to claim 13, wherein the surface roughness of the first region is 0.12 to 4.4 μm.

15. The ultrasonic sensor according to claim 13, wherein the surface roughness of the first region is 1.2 to 3.8 μm.

* * * * *